United States Patent [19]
Chen et al.

[11] Patent Number: 5,989,653
[45] Date of Patent: Nov. 23, 1999

[54] PROCESS FOR METALLIZATION OF A SUBSTRATE BY IRRADIATIVE CURING OF A CATALYST APPLIED THERETO

[75] Inventors: Ken S. Chen; William P. Morgan; John L. Zich, all of Albuquerque, N.Mex.

[73] Assignee: Sandia Corporation, Albuquerque, N.Mex.

[21] Appl. No.: 08/986,379

[22] Filed: Dec. 8, 1997

[51] Int. Cl.$^6$ ...................................................... B05D 3/00
[52] U.S. Cl. ..................... 427/553; 427/554; 427/555; 427/558; 427/557; 427/581; 427/597
[58] Field of Search .......................... 427/96, 553–556, 427/558, 581, 597, 98, 304, 372.2, 437, 443.1

[56] References Cited

U.S. PATENT DOCUMENTS

| | | |
|---|---|---|
| 4,981,715 | 1/1991 | Hirsch et al. ............................ 427/53.1 |
| 5,153,023 | 10/1992 | Orlowski et al. ........................ 427/555 |
| 5,192,581 | 3/1993 | Hirsch et al. ............................ 427/556 |
| 5,348,574 | 9/1994 | Tokas et al. ............................ 106/1.11 |

*Primary Examiner*—Brian K. Talbot
*Attorney, Agent, or Firm*—V. Gerald Grafe

[57] ABSTRACT

An improved additive process for metallization of substrates is described whereby a catalyst solution is applied to a surface of a substrate. Metallic catalytic clusters can be formed in the catalyst solution on the substrate surface by irradiating the substrate. Electroless plating can then deposit metal onto the portion of the substrate surface having metallic clusters. Additional metallization thickness can be obtained by electrolytically plating the substrate surface after the electroless plating step.

23 Claims, 4 Drawing Sheets

| Wavelength | Plating Quality |
|---|---|
| >780 nm | no plating |
| >700 nm | no plating |
| >630 nm | no plating |
| 520 nm | no plating |
| 440 nm | no plating |
| 400 nm | no plating |
| >390 nm | no plating |
| 350 nm | poor plating |
| 330 nm | good plating |
| 326.1 nm | good plating |
| 310 nm | poor plating |
| 300 nm | no plating |
| 266.5 nm | no plating |
| 254 nm | no plating |
| 220 nm | no plating |

Figure 2

| Length of UV activation (hours) | Total energy flux (J/cm$^2$) | Plating quality |
|---|---|---|
| 2.0 | 11.4 | no plating |
| 2.5 | 15.0 | no plating |
| 3.0 | 19.5 | poor plating |
| 3.5 | 24.7 | good plating |
| 4.5 | 27.5 | good plating |
| 5.0 | 34.0 | good plating |
| 5.5 | 35.0 | good plating |

Figure 3

# PROCESS FOR METALLIZATION OF A SUBSTRATE BY IRRADIATIVE CURING OF A CATALYST APPLIED THERETO

This invention was made with Government support under Contract DE-AC04-94AL85000 awarded by the U.S. Department of Energy. The Government has certain rights in the invention.

BACKGROUND OF THE INVENTION

This invention relates to the field of additive metallization of substrates. Many electronic applications require patterned metallization of nonconductive substrates for interconnection among electronic devices. Examples of such applications include high density packaging (multi-chip modules), antennas, flex circuits, printed wiring boards, and flat panel displays. The metallic interconnects are conventionally formed by subtractive processes. Modern additive processes attempt to overcome the drawbacks of subtractive processes.

In a subtractive metallization process, a surface of the substrate is first fully coated. Alternatively, a metal sheet can be laminated onto a flat substrate using adhesive. Selected portions of the metal plating are then etched to leave the desired patterned metallization. Vacuum-assisted physical vapor deposition and sputtering deposition are often used to achieve en masse plating. Physical vapor and sputtering deposition require high vacuum, and consequentially high capital equipment and operating costs. Those deposition processes can also result in poor adhesion of the metal to the substrate.

Full coverage metal plating can also be achieved by sensitizing a surface of the substrate with a palladium chloride/tin chloride bath and chemically reducing palladium ions to form catalytic clusters. Electroless plating followed by electrolytic plating deposits metal on the surface. This process can be costly due to the large number of wet processing steps, and the chemical dissimilarity between the metal coating and the substrate discourages chemical bonding therebetween. Consequently, the metal only weakly adheres to the substrate.

After full coverage metal plating, a layer of resist (a photoresist is often used) is deposited in a pattern on top of the metal layer, with the pattern corresponding to the desired metallization pattern. A subsequent etching step removes all the metal except that protected by the patterned resist layer. The etching process is usually time consuming and costly, and can require the use of materials unfriendly to the environment.

Additive processes have been proposed to overcome the environmental drawbacks of subtractive processes. Current additive processes achieve only thin layers of metallization, limiting their practical applications. See, e.g., Tokas et al., U.S. Pat. No. 5,348,574. Current additive processes also suffer from poor adhesion, just as with the subtractive processes. Some of the additive processes retain resist and etching steps; consequently, they suffer from the same environmental hazards as the subtractive processes. See, e.g., Hirsch et al., U.S. Pat. No. 5,192,581. Others have process limitations that limit their uses with widely available substrate materials. See, e.g., Orlowski et al., U.S. Pat. No. 5,153,023. Metal/foil adhesive processes use costly thick metal foils and poorly adhering low molecular weight polymer adhesives.

Accordingly, there remains a need for improved additive metallization processes, specifically for processes that provide fine line metallization and that can provide the increased metallization thickness required in practical applications such as printed wiring boards.

SUMMARY OF THE INVENTION

The present invention provides an improved process for additive metallization of substrates. The improved process comprises applying a catalyst solution onto the substrate. The catalyst solution can coat an entire surface of the substrate or can be selectively applied to only a portion of a substrate surface. The concentration of solvent in the layer of catalyst solution on the substrate surface can be reduced by heating the coated substrate. Metallic clusters can be formed in the remaining catalyst layer by irradiating the substrate with suitable electromagnetic radiation. Masks, lithographic processes, or optical focusing can provide precision control of the cluster formation, allowing subsequent metallization steps to realize high density features. Electroless plating can then deposit metal onto the coated portion of the substrate. Additional metallization thickness can be obtained by electrolytically plating the substrate after the electroless plating step. The improved process requires only one wet processing step (applying the catalyst solution onto the substrate) and does not require a high vacuum, so capital and operational costs are less than with existing processes. The improved process also does not require an etching step, avoiding the environmental hazards of chemical etching. The improved process results in increased metallization thickness, making it suitable for a wider range of applications than existing processes. The improved process can provide very fine metallic features, allowing high density connections.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

FIG. 2 shows plating results with varying radiation wavelength.

FIG. 3 shows plating results with varying radiation energy flux.

DETAILED DESCRIPTION OF THE INVENTION

The present invention provides a novel process for additive metallization of substrates.

FIG. 1 (a–f) shows a substrate during processing according to the present invention. The process comprises applying a catalyst solution 2 to a surface of a substrate 1. The catalyst solution 2 comprises a solvent, a carrier, and metal catalyst ions. The catalyst solution 2 can cover an entire surface of the substrate 1 or can be selectively applied to only a portion of a surface of substrate 1 using techniques known to those skilled in the art. FIG. 1b shows the substrate after the concentration of solvent in the layer of catalyst solution 2 on the surface of substrate 1 has been reduced. By way of example, heating can reduce the concentration of solvent in the layer of catalyst solution 2 on the surface of substrate 1 and also dry the surface, allowing easier handling during subsequent processing.

Figure 1A:
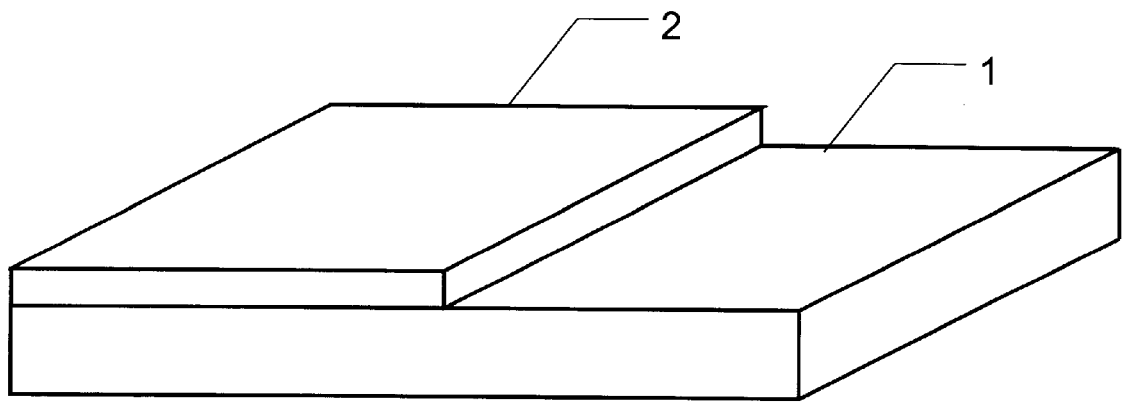
FIGS. 1a, 1b, 1c, and 1d show a substrate during processing according to the present invention.
Figure 1B:
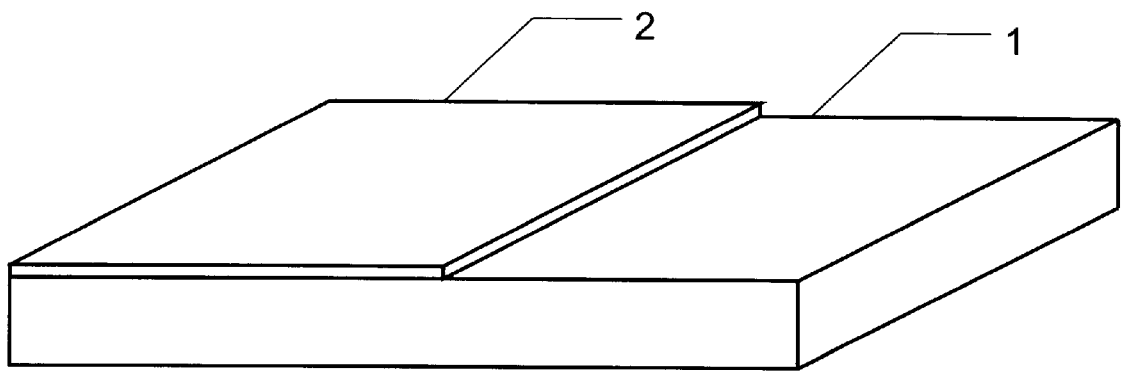
Figure 1C:
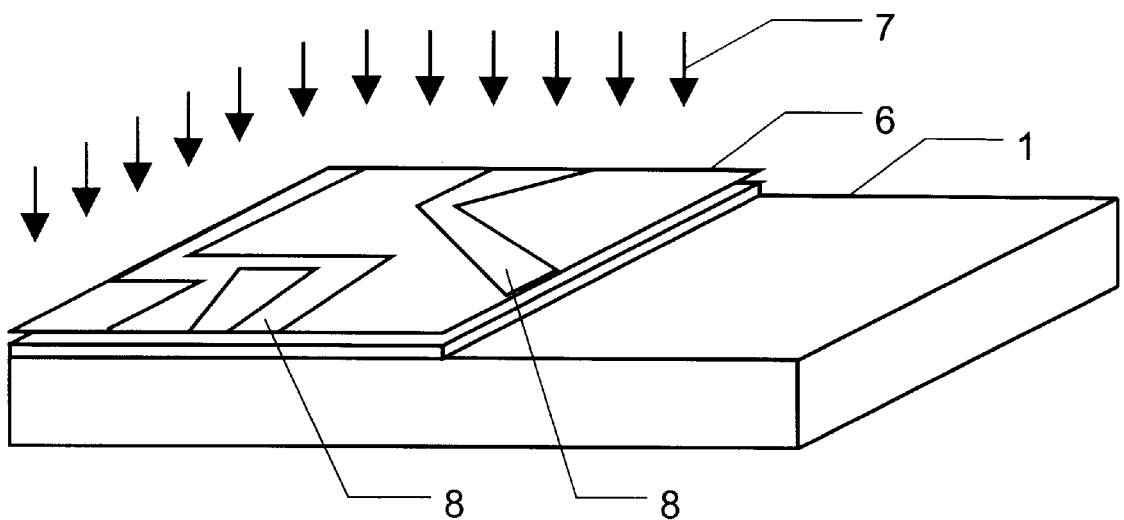

FIG. 1c shows the substrate 1 with a mask 6 mounted thereon. Mask 6 can shield portions of the substrate 1 from irradiation (represented by lines 7 in the figure). Mask 6 can have cutouts 8 corresponding to portions of the substrate 1 where metallization is desired. Irradiating the substrate 1 with appropriate electromagnetic radiation can form metallic clusters in the portions of the remaining catalyst layer not blocked by mask 6.

Figure 1D:
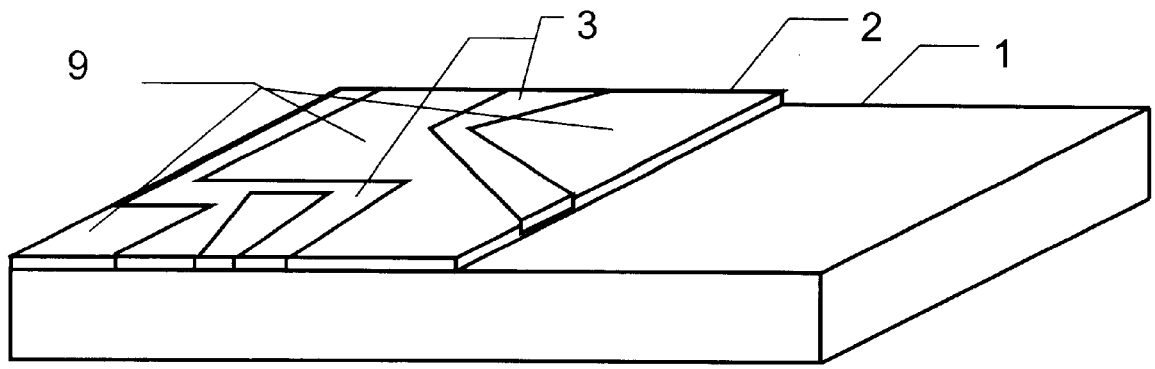

FIG. 1d shows the substrate 1 after metallic clusters 3 have been formed in the catalyst layer 2. The portions of the catalyst layer 9 shielded by the mask 6 have no metallic clusters; the shaded portions corresponding to cutouts in the mask 6 have metallic clusters 3.

Figure 1E:
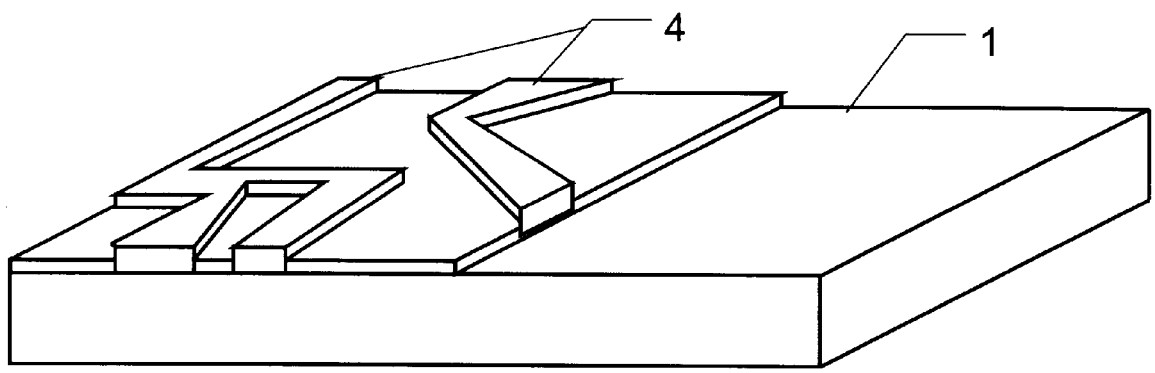
Figure 1F:
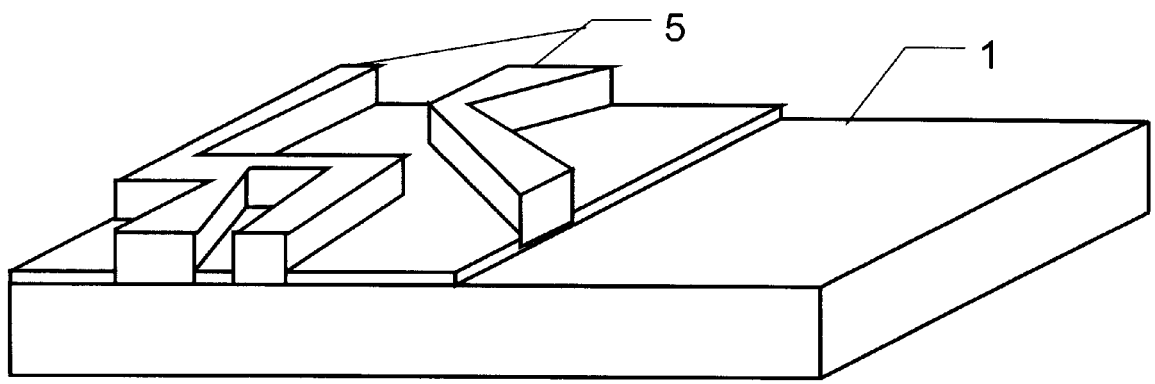

FIG. 1e shows the substrate after electroless plating has deposited metal 4 onto the portions of the surface of substrate 1 containing metallic clusters. If desired, electrolytic plating can then deposit additional metal 5 onto metal deposited electrolessly, as shown in FIG. 1f.

Application performance objectives often constrain the choice of a substrate material. For example, the application might require that the substrate be a good electrical insulator. The application might require that the substrate remain stable when subjected to very high or very low temperatures, or to certain temperature variations. The application might require a substrate capable of withstanding repeated stretching or bending cycles. The application might also require that the substrate have properties compatible with other components (e.g., thermal expansion). The present invention is suitable for use with, for example, commonly used organic polymeric substrate materials such as polyimide, polyester, polyurethane, and epoxy-based polymers.

The choice of substrate material affects the composition chosen for the catalyst solution. The catalyst solution comprises a suitable polymer carrier (including monomers and oligomers), catalyst ions, and a solvent or solvents. Palladium can be used as a catalyst because of its low cost. Gold, platinum, iridium, rhodium, and ruthenium can also be used as catalysts. Palladium ions can be obtained by dissolving a palladium salt (e.g., palladium chloride or palladium acetate) in the catalyst solution. Ammonium hydroxide can be used to complex the catalyst ions to prevent them from forming complexes with the polymer carrier. The catalyst solution can comprise additional components such as surfactants to improve wettability and hence uniformity of substrate coverage. The specific choices for carrier and solvent can depend on the substrate chemistry and surface features, as discussed below.

The polymer carrier can be chosen so that it achieves several basic objectives:

The polymer carrier should be dissolved by the solvent so that a solution results.

The polymer carrier should not complex with palladium ions on mixing with the palladium salt.

The polymer carrier should allow palladium ions, palladium atoms, or both to diffuse within a solid matrix of the polymer carrier during activation.

The polymer carrier should be identical to, similar to, or compatible with the substrate upon solidification so that good adhesion is created between the substrate and the solid matrix of the polymer carrier.

For organic polymer substrate material, numerous polymers, including monomers and oligomers, can be suitable carriers. A polyamic-acid carrier can be used with solvents such as 1-methyl-2-pyrrolidinone. For example, a solution of 34.6% by weight polyamic acid, 62.35% by weight 1-methyl-2-pyrrolidinone, 0.925% by weight palladium acetate, 2.1% by weight concentrated ammonia hydroxide, and 0.025% by weight FC 430 (a fluoroaliphatic polymeric ester surfactant from 3M Corporation) forms a suitable catalyst solution. A polyamic-acid carrier becomes polyimide once polymerized or cured, and therefore is especially suitable for use with polyimide substrate materials. Skybond 3300 (24–28% polymer content, 10,000–20,000 cps viscosity), from Summit Precision Polymers Corporation, is an example of a suitable polyamic acid.

A polyvinyl butyral carrier can be used with a solvent such as a mixture of 4-methyl-2-pentanol and n-butanol. For example, a solution of 4.9% by weight polyvinyl butyral, 1.45% by weight palladium chloride, 30.0% by weight 4-methyl-2-pentanol, and the remainder n-butanol forms a suitable catalyst solution.

A polyvinyl chloride latex resin carrier can be used with water as a solvent. Aqueous solutions can be less environmentally hazardous than organic solvent-based solutions. For example, a solution of 18.2% by weight polyvinyl chloride latex resin, 3.3% by weight butyl cellosolve, 3.4% by weight palladium acetate, 7.5% by weight concentrated ammonium hydroxide, 5.4% by weight polyurethane resin (such as the ACRYSOL RM-8W thickening agent marketed by Rohm and Haas), 4.5% by weight Triton-X 100 (a polyethylene glycol-based surfactant marketed by Aldrich), and the remainder water forms a suitable catalyst formulation. Both the polyvinyl butyral carrier and the polyvinyl chloride latex carrier can be cured at low temperatures (approximately 150° C. to 90° C.). Accordingly, they are suitable for use with substrates such as polyester and epoxy-based polymers that cannot withstand the high temperatures needed for curing a polyamic-acid carrier.

The catalyst solution is applied to a surface of the substrate. Dipping, spraying, slide coating, slot coating, roll coating, Meyer-rod coating, gravure coating, and drawdown processes known to those skilled in the art can coat an entire surface of the substrate. Full coating can result in full metallization of the substrate surface, or selective metallization if irradiation is selective. Alternatively, processes such as screen printing, flexographic printing, plotting, ink-jet printing, and gravure printing can apply catalyst solution to only selected portions of the substrate surface. The substrate surface will be metallized only where the catalyst solution was applied and subsequently irradiated.

Processing such as heating the substrate can reduce the concentration of solvent in the catalyst solution on the substrate surface. Solvent removal can dry the catalyst coating and allow easier handling and storage. A properly dried catalyst layer on a substrate can be stored for many years before activation. For example, a polyamic-acid catalyst solution on a polyimide substrate can be dried by heating it for 15 minutes to 60 minutes at temperatures of 50° C. to 100° C. For ease of handling, the majority of the solvent should be removed. Excessive drying temperatures should be avoided because they can trap solvent beneath thick polymer carrier surface skins. Generally, heating to at least one third the boiling temperature of the solvent until at least half the solvent is removed is desirable; heating until 90% of the solvent is removed is preferred.

Electromagnetic radiation supplied to the substrate and catalyst coating activates the palladium catalyst. Irradiative activation accomplishes several important tasks:

It produces catalytic metallic palladium clusters by reducing the palladium ion to palladium metal and by diffusion of palladium metal to form clusters by nucleation and growth.

It polymerizes or otherwise cures the polymer carrier in the catalyst coating to foster cohesive strength within the cured carrier.

It fosters interdiffusion of molecules between the substrate and the polymer carrier, causing enhanced adhesion between the substrate and the cured polymer carrier.

Lithographic techniques known to those skilled in the art can be used to selectively irradiate portions of the coated substrate. For a Skybond 3300 catalyst solution, irradiation with ultraviolet light, having a wavelength from 300 nm to 390 nm (310 nm to 350 nm preferred) with a total energy flux of over 15.0 joules per square centimeter can activate the catalyst layer. The specific wavelength and total energy flux required can be dependent on the choice of catalyst; wavelengths and energy fluxes sufficient to form palladium clusters averaging at least about 5 nm can result in satisfactory plating.

After irradiative activation, any one of a plurality of electroless plating processes can deposit metal on the substrate. Electroless plating processes are known to those skilled in the art. See, e.g., Electroless Plating: Fundamentals and Applications, edited by G. 0. Mallory and J. B. Hajdu, 1990. Commercial copper plating baths, for example Shipley Cuposit 328, are suitable for use with the present invention (Shipley Cuposit 328 bath conditions: 3 g/L suspended copper, 7.5 g/L formaldehyde, 23° C. operating temperature, 10.2 bath pH). Other metals such as gold, silver, and nickel can also be deposited. In electroless plating, reducing agents such as formaldehyde are oxidized to produce electrons. Metal ions in the plating bath consume the electrons and are reduced to metal. The reduction chemical reaction proceeds in the presence of a catalyst such as palladium metal or palladium metal clusters. Palladium metal clusters greater than 5 nm in average size are effective as catalysts in electroless plating processes.

Heating the substrate after electroless plating can significantly increase adhesion of the metallization to the substrate. In general, long exposure to temperatures sufficient to soften the substrate (i.e., above the glass transition temperature of the substrate) and cure the polymer carrier is desirable. The heating must not melt the substrate, but long exposure to sufficient temperatures promotes adhesion between the substrate and the polymer carrier. For example, a substrate can be heated for at least one hour at 80° C. to 200° C. (two hours at 170° C. preferred) Heating can also remove moisture at the polymer-metal interface that reduces bonding strength. Heating can also cause oxidation of metal at the polymer-metal interface, which can increase bonding strength and thereby improve adhesion. Additional heating can also help further cure the polymer carrier.

Existing electroless plating processes can normally deposit metal up to a few microns thick in a reasonable time. A new commercial copper bath, Circuposit 71 Full Build Electroless Copper, marketed by Shipley, can deposit 25 microns of copper in ten hours. It has also been reported that 25 micron thick copper can be deposited using commercial baths in eight to fourteen hours. See, e.g., "Electroless Plating: Fundamentals and Applications," Chapter 13, edited by Mallory and Hajdu, 1990.

Alternatively, electrolytic plating can be used to deposit additional metal to the desired thickness on the seed metal layer formed by electroless plating. Electrolytic plating is more efficient (has a higher plating rate) than electroless plating. Electrolytic plating processes comprise applying an electric current through a copper anode to provide electrons needed in the reduction chemical reaction at the cathode and are known to those skilled in the art. See, e.g., Electroplating (a chapter in Comprehensive Treatise of Electrochemistry Vol. 2, Bockris, Conway, Yeager, and White, Plenum Press, N.Y. 1981); Fundamentals of Metal Deposition (Raub and Muller, Elsevier, Amsterdam, 1967). Commercial electrolytic plating solutions, for example the LeaRonal Glean Copper PC Plating Bath, can be used to increase the metal thickness from the seed metal layer deposited by electroless plating (LeaRonal Glean Copper PC Plating Bath composition: 12 oz./gal. copper sulfate, 25 oz./gal. sulfuric acid, 70 ppm chloride, 0.5% Copper Glean PC additive; process conditions: air agitation, 30 amps/square foot cathode current density, phosphorized copper anode).

The following non-limiting examples further illustrate the invention.

EXAMPLE 1

This example demonstrated that ultraviolet light or electromagnetic waves can be employed to activate or generate palladium clusters that are necessary to catalyze the substrate surface for electroless plating in fine-line patterned metallization applications. A Skybond 3300 polyamic acid (purchased from Summit Precision Polymers in Fort Lee, N.J.) catalyst solution was coated onto a 2.75 inch×6 inch, 5 mil thick Kapton sheet substrate uniformly using a GARDCO size 20 metering rod (or draw-down bar; available from GARDCO Company). After coating, the sample was immediately transferred to a low-temperature oven and dried at 80° C. for 30 minutes. After drying, the sample was placed on top of a 5.75 inch×4.875 inch and 0.125 inch thick Soda Lime Float glass. A Mylar circuit pattern mask was placed on top of the sample. A 5.75 inch×4.875 inch and 0.125 inch thick Soda Lime Float glass was then placed on top of the Mylar mask. Next, the glass-sample-mask-glass sandwich was placed outdoor in the direct New Mexico sunlight (starting at 9:15 A.M.) while simultaneously activating a DYNACHEM model 500 UV Integrating Radiometer. The sample was irradiated with direct sunlight for 6 hours (from 9:15 A.M. to 3:15 P.M.) and the Radiometer registered a total energy flux of 22.4 joules per square cm (or $J/cm^2$). The UV-activated sample was then placed vertically into a Shipley Cuposit 328 electroless copper bath and plated at room temperature (23° C.) for 30 minutes. The plated sample was rinsed with water and dried by blowing nitrogen gas on it. It was observed that copper was plated uniformly on the unmasked areas to yield a circuit pattern with 2 mil (50 microns) metal lines and 2 mil spacing between lines. Adhesion was tested by applying common transparent tape, with pressure, to the metallized areas. Peeling the tape produced no apparent metal separations from the substrate.

EXAMPLE 2

This example demonstrated the relationship between catalyst activation and the wavelength of ultraviolet (UV) light or electromagnetic waves employed. A 5.5 inch×4.5 inch, 5 mil thick Kapton substrate was coated with the Skybond polyamic acid catalyst solution using a GARDCO size 20 metering rod, and dried at 80° C. for 30 minutes (as in Example 1). The sample was then placed on top of one piece of 5.75 inch×4.875 inch and 0.125 inch thick Soda Lime Float glass. Filters, which pass only selected wavelengths of light, were placed on the top surface of the sample and then the filter-covered sample was subjected to UV radiation.

Various filter and wavelength combinations were tested. The sample, along with the filters sitting on the top surface being irradiated, was placed outdoors (starting at 9 A.M.) for eight hours. The UV-activated sample was then placed vertically into a Shipley Cuposit 328 electroless copper bath and plated at room temperature (23° C.) for 30 minutes. The results obtained are summarized in FIG. 2. In the figure, "Wavelength" refers to the wavelength of light passed through the filter and to the substrate.

EXAMPLE 3

This example demonstrated how the total energy flux impinging on the catalyst layer affects the catalytic activity and thus plating quality. Seven dried catalyst samples were prepared the same way as in Examples 1 & 2. All seven samples were placed outdoors in direct sunlight for catalyst activation. The activation process was terminated at 30 minute intervals by taking one sample off UV radiation at a time and recording the total energy flux then indicated by a Radiometer. The UV-activated samples were then placed vertically into a Shipley Cuposit 328 electroless copper bath and plated at room temperature (23° C.) for 30 minutes. The results obtained are summarized in FIG. 3. The plating quality for samples with total energy flux greater than about 24.7 Joules per square centimeter were about the same.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. A process for additive metallization of a substrate, comprising:
    a) coating a first portion of a surface of the substrate with a catalyst solution comprising a carrier, a solvent, and catalyst ions;
    b) irradiating a second portion of said first portion to reduce the catalyst ions to form catalyst clusters; and
    c) placing metal ions in proximity with said catalyst clusters and reducing said metal ions in the presence of said catalyst clusters and depositing metal onto said second portion.

2. The process of claim 1, wherein the substrate is made of a material selected from the group consisting of: polyester, polyurethane, epoxy-based polymer, and combinations thereof.

3. The process of claim 1, wherein the carrier is selected from the group consisting of: polyvinyl chloride, polyvinyl butyral, and combinations thereof.

4. The process of claim 1, wherein the solvent is selected from the group consisting of: 4-methyl-2-pentanol, n-butanol, water, and combinations thereof.

5. The process of claim 1, wherein the catalyst ions are selected from the group consisting of: palladium ions, gold ions, platinum ions, iridium ions, rhodium ions, ruthenium ions, and combinations thereof.

6. The process of claim 1, further comprising reducing the concentration of solvent in catalyst solution on the substrate surface until over half of the solvent is removed from the substrate surface, before the irradiating step.

7. The process of claim 1, further comprising curing the carrier by heating the substrate to a temperature above the curing temperature of the carrier and below the melting temperature of the substrate until at least 50% of the carrier has been cured, after the reducing step.

8. The process of claim 1, wherein the catalyst ions are reduced by irradiating the substrate with electromagnetic radiation until catalyst clusters averaging about 5 nm in size are produced.

9. The process of claim 1, further comprising heating the substrate after depositing metal.

10. The process of claim 1, wherein the step of depositing metal comprises electroless plating.

11. The process of claim 10, further comprising electrolytic plating after electroless plating.

12. A process for additive metallization of a polymeric substrate, comprising:
    a) coating a first portion of a surface of said substrate with a catalyst solution comprising a polyamic acid carrier, a 1-methyl-2-pyrrolidinone solvent, and palladium ions;
    b) reducing said palladium ions to form palladium clusters by irradiating a second portion of said first portion with ultraviolet light wherein the total energy flux impinging on the surface is greater than about 15 Joules per square centimeter in the wavelengths from about 390 nm to about 300 nm; and
    c) electroless plating metal onto said second portion.

13. The process of claim 12, wherein the substrate comprises polyimide.

14. The process of claim 12, further comprising heating the substrate after electroless plating for at least 1 hour at temperatures of at least 140° C.

15. The process of claim 12, further comprising electrolytic plating after electroless plating.

16. A process for additive metallization of a nonconductive substrate, comprising:
    a) coating a first portion of a surface of said substrate with a catalyst solution comprising a polyvinyl chloride latex carrier, a water solvent, and palladium ions;
    b) reducing said palladium ions to form palladium clusters by irradiating a second portion of said first portion; and
    c) electroless plating metal onto said second portion.

17. The process of claim 16, further comprising heating the substrate after electroless plating for at least 1 hour at temperatures of at least 80° C.

18. The process of claim 16, further comprising electrolytic plating after electroless plating.

19. The process of claim 12, wherein the total energy flux impinging on the surface is greater than about 24 Joules per square centimeter in the wavelengths from about 350 nm to about 310 nm.

20. The process of claim 1, wherein the carrier comprises polyamic acid.

21. The process of claim 1, wherein the solvent comprises 1-methyl-2-pyrrolidinone.

22. A process for additive metallization of a nonconductive substrate, comprising:
    a) coating a first portion of a surface of said substrate with a catalyst solution comprising a polyvinyl butyral carrier, palladium ions, and a solvent selected from the group consisting of: 4-methyl-2-pentanol, n-butanol, and combinations thereof;
    b) reducing said palladium ions to fonn palladium clusters by irradiating a second portion of said first portion; and
    c) electroless plating metal onto said second portion.

23. The process of claim 1, wherein the substrate comprises polyimide.

* * * * *